US012008432B2

(12) United States Patent
Schmitt et al.

(10) Patent No.: US 12,008,432 B2
(45) Date of Patent: Jun. 11, 2024

(54) PASSIVE MICROMECHANICAL COUNTER

(71) Applicant: Ruhr-Universität Bochum, Bochum (DE)

(72) Inventors: Philip Schmitt, Bochum (DE); Martin Hoffmann, Bochum (DE)

(73) Assignee: Ruhr-Universität Bochum, Bochum (DE)

( * ) Notice: Subject to any disclaimer, the term of this patent is extended or adjusted under 35 U.S.C. 154(b) by 168 days.

(21) Appl. No.: 17/636,942

(22) PCT Filed: Aug. 20, 2020

(86) PCT No.: PCT/EP2020/073425
§ 371 (c)(1),
(2) Date: Feb. 21, 2022

(87) PCT Pub. No.: WO2021/032859
PCT Pub. Date: Feb. 25, 2021

(65) Prior Publication Data
US 2022/0277185 A1 Sep. 1, 2022

(30) Foreign Application Priority Data
Aug. 22, 2019 (DE) .................... 102019122671.6

(51) Int. Cl.
*G06M 1/10* (2006.01)
*B81B 3/00* (2006.01)

(52) U.S. Cl.
CPC .......... *G06M 1/108* (2013.01); *B81B 3/0064* (2013.01); *B81B 2201/0292* (2013.01); *B81B 2203/04* (2013.01)

(58) Field of Classification Search
None
See application file for complete search history.

(56) References Cited

U.S. PATENT DOCUMENTS 6,115,077 A * 9/2000 Tsukagoshi .......... H04N 7/0885
348/E5.077
2015/0022053 A1 1/2015 Minotti et al.

FOREIGN PATENT DOCUMENTS

DE 10122470 A1 11/2002
DE 102016220111 B3 2/2018

OTHER PUBLICATIONS

International Search Report (w/ English translation) for corresponding Application No. PCT/EP2020/073425, dated Dec. 11, 2020, 7 pages.

(Continued)

Primary Examiner — Cassandra F Cox
(74) Attorney, Agent, or Firm — Dority & Manning, PA

(57) ABSTRACT

A passive micromechanical counter for counting and storing a number of mechanical pulses includes at least one memory cell, the memory cell having a cell input, a latching mechanism and an electromechanical coding unit, the cell input being designed to mechanically transmit the mechanical pulse to the latching mechanism, and the latching mechanism being designed to store the number of mechanical pulses transmitted by means of its discrete latching position. It is provided that an electrical digital signal can be generated by applying an electrical voltage to the electromechanical coding unit, the electrical digital signal representing the discrete latching position of the latching mechanism.

13 Claims, 5 Drawing Sheets

(56) References Cited

OTHER PUBLICATIONS

Figure 1:
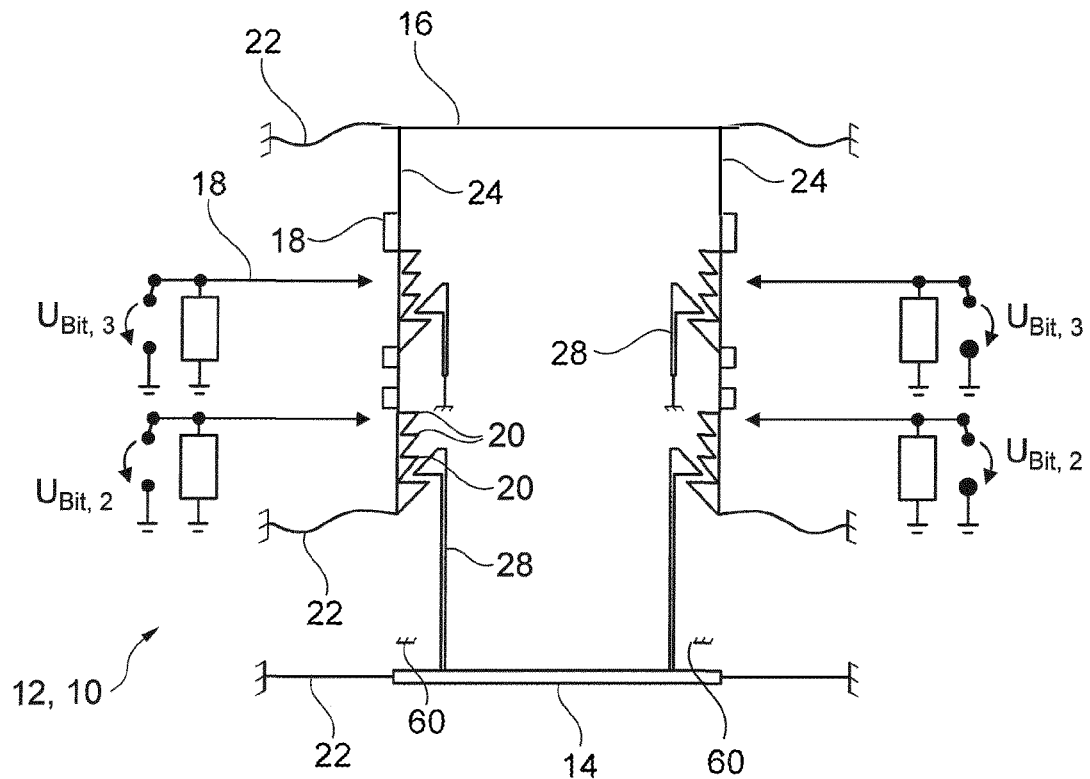

Hoffmann et al., "Non-electrical sensing and storing an alternative to electrical energy harvesting," *Procedia Engineering*, 2016, vol. 168, pp. 1621-1625.
Mehner et al., "Passive microsensor for binary counting of numerous threshold events," *Proceedings of SPIE*, 2015, vol. 9517, 11 pages.
Schmitt et al., "A Micromechanical Binary Counter with MEMS-Based Digital-to-Analog Converter," *Proceedings*, vol. 2, No. 13, Nov. 21, 2018, 5 pages.
Office Action (w/ English translation) for corresponding German Application No. 102019122671.6, dated Mar. 3, 2020, 4 pages.

\* cited by examiner

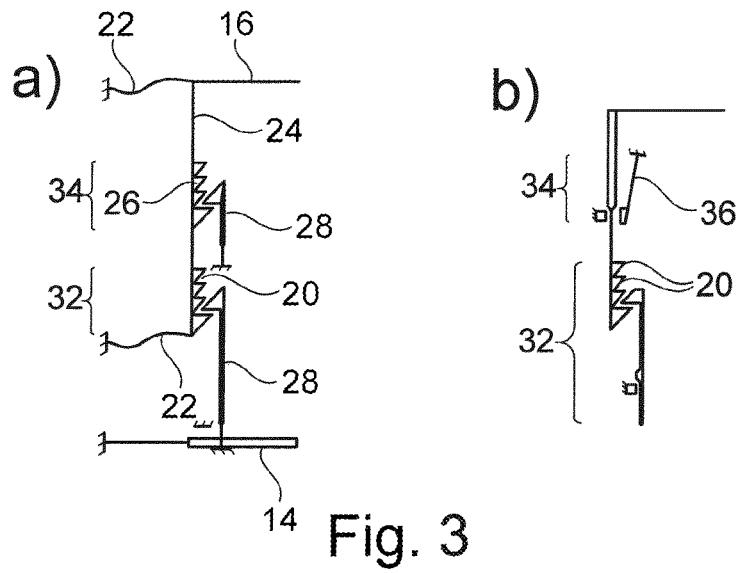
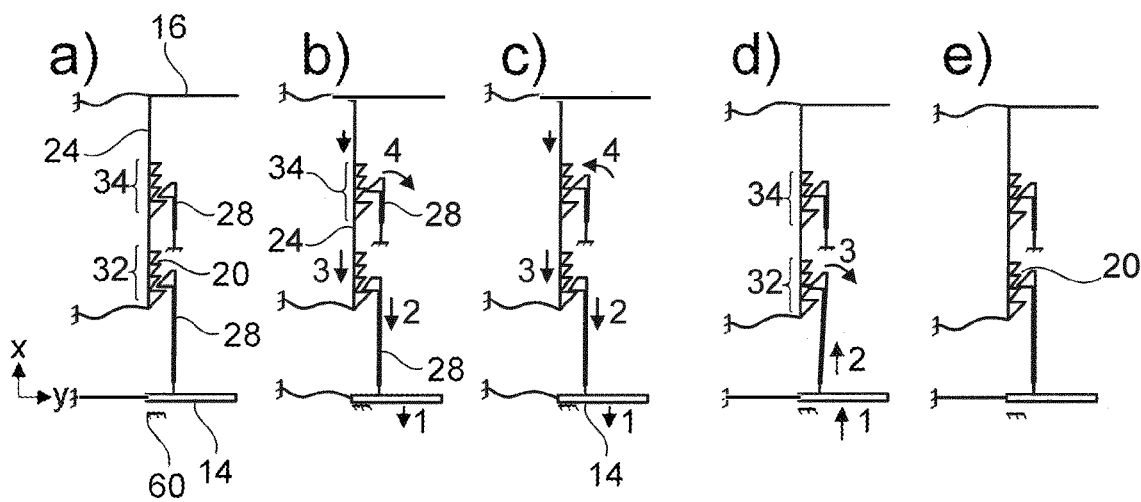
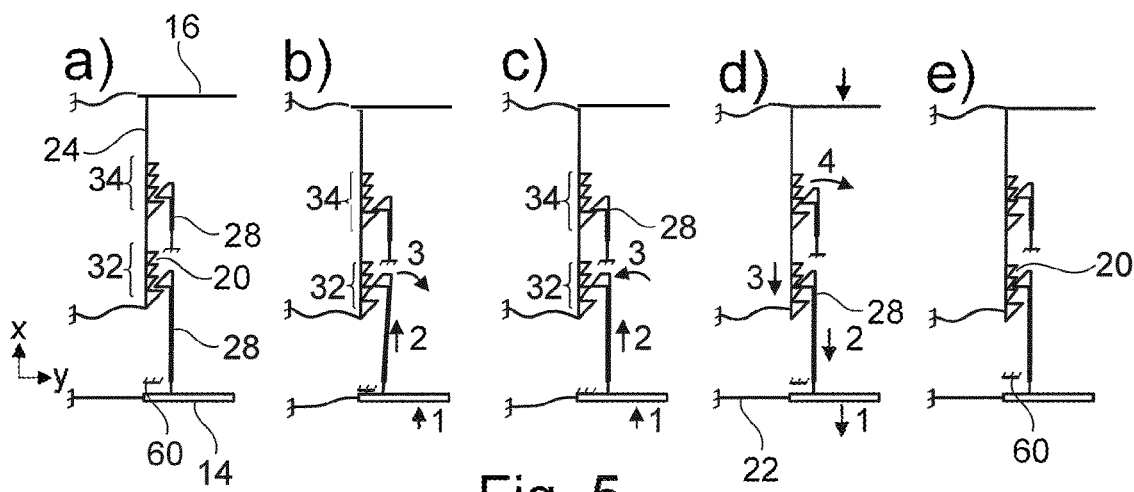

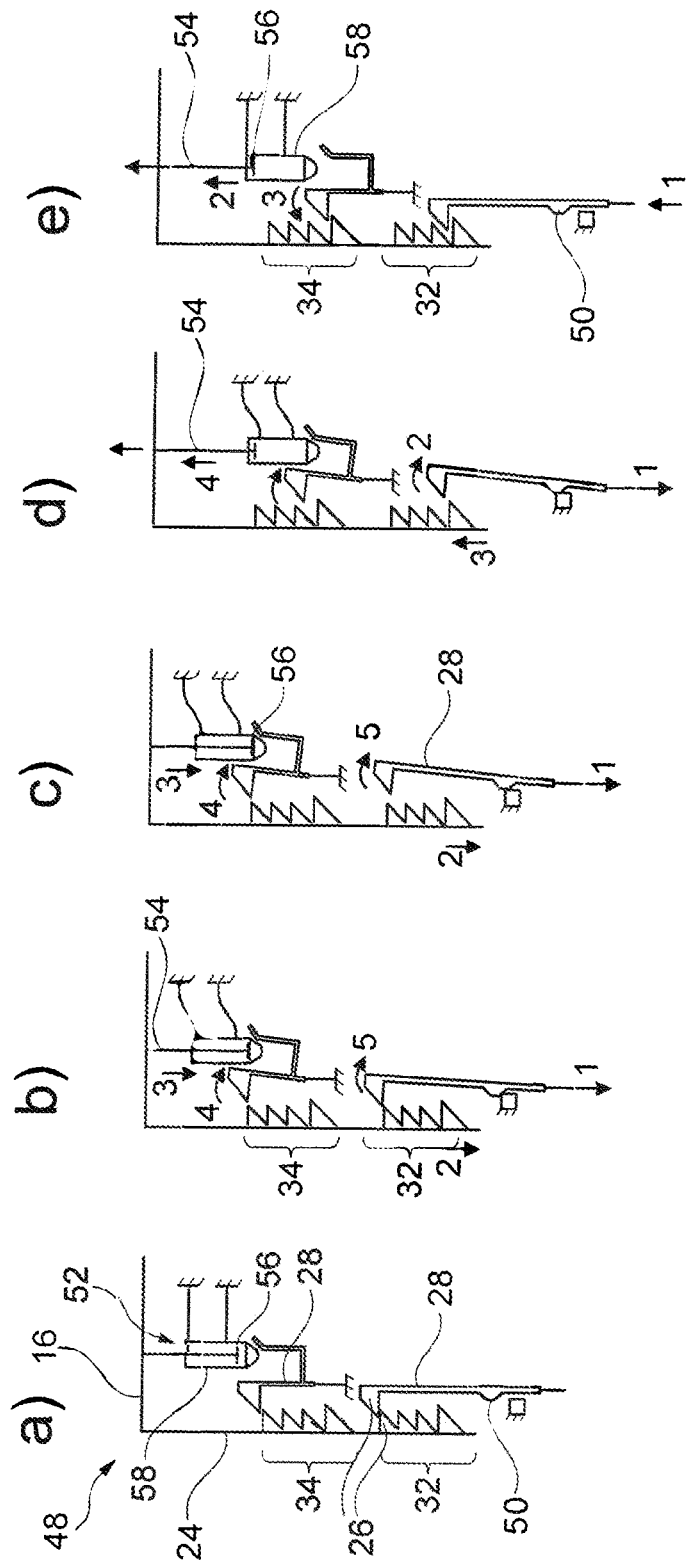

PASSIVE MICROMECHANICAL COUNTER

The present application is a U.S. national phase application of International Application No. PCT/EP2020/073425, filed Aug. 20, 2020, which, in turn, claims the right of priority to German Application No. 102019122671.6, filed Aug. 22, 2019, the disclosures of both of which are hereby incorporated by reference herein in their entirety for all purposes.

The invention relates to a passive micromechanical counter for counting and storing a number of mechanical pulses.

Various sensors and sensor networks are usually used to monitor important components. External influences such as the effects of temperature or acceleration on certain components can be continuously recorded and electronically evaluated. A real-time evaluation of detailed measurement results is particularly important if a specific event is to be triggered as a reaction to said measurement results.

However, instead of continuously recording a detailed time-resolved sequence of measured values, it is often sufficient to register and save only particularly critical limit value events. Such limit value exceedances include, for example, exceeding certain temperature, expansion or acceleration limits. The frequency of such events often determines the remaining service life of specific components. Knowledge of the number of limit value exceedances that have occurred so far allows heavily used components to be identified and replaced early on during maintenance work, in order to avoid failure or damage to the entire system.

The integration of active sensors that continuously record measured values often fails because of the necessary energy supply for components that are difficult to access or move. Although many sensors could be supplied with energy via energy harvesting or batteries, these types of sensors then have to be maintained at high cost.

Accordingly, there is a need to determine the number of events that exceed the limit without having to provide an electrical power supply therefor. Accordingly, it is the object of the invention to provide a counter that is able to allow limit value events to be counted without an electrical energy supply and to store the number counted without an electrical energy supply.

This object is achieved by the features of the independent patent claim. Preferred developments can be found in the dependent claims.

According to the invention, a passive micromechanical counter for counting and storing a number of mechanical pulses comprising at least one memory cell is provided, the memory cell comprising a cell input, a latching mechanism and an electromechanical coding unit, the cell input being designed to mechanically transmit the mechanical pulse to the latching mechanism, the latching mechanism being designed to store the number of mechanical pulses transmitted by means of its discrete latching position, an electrical digital signal being able to be generated by applying an electrical voltage to the electromechanical coding unit, and the electrical digital signal representing the discrete latching position of the latching mechanism.

The basic idea of the invention is that the counter can count mechanical pulses without an electrical energy supply and store the number thereof via the mechanical latching mechanism. The energy required for counting and storing is obtained directly from the mechanical pulse. The mechanical pulse preferably comprises a mechanical shock, a force pulse and/or a displacement pulse, More preferably, the magnitude of the mechanical pulse is in the range of 100 to 2000 µN, and/or in the range of a displacement of 1 to 100 µm of the cell input. A mechanical pulse is preferably understood to mean a force that acts briefly at the cell input. The mechanical pulse is picked up by the cell input of the memory cell and mechanically transmitted to the latching mechanism. The latching mechanism stores the number of mechanical pulses transmitted by means of its discrete latching position. Counting and storing is therefore purely mechanical and requires no electrical energy. It is accordingly a passive counter. Reading out the stored number of mechanical pulses electrically is a challenge with passive counter. According to the invention, reading out is achieved in which the counter comprises an electromechanical coding unit designed such that an electrical digital signal can be generated by applying an electrical voltage to the electromechanical coding unit, the signal representing the discrete latching position of the latching mechanism. In other words, the counter only requires electrical energy or an electrical voltage to read out the stored counter reading. The electrical voltage can be provided, for example, during the reading process via an RFID tag. As soon as a voltage is applied to the electromechanical coding unit, an electrical digital signal is generated and preferably output. In particular, no further complex electronics, such as an analog-to-digital converter, are required to generate the electrical digital signal. Active electrical components such as amplifiers, comparators and/or transistors can preferably be dispensed with.

The counter is a micromechanical counter. In the context of the invention, this means that the counter preferably has dimensions in the µm range to mm range. The external dimensions of the memory cell are preferably less than 2000 µm. In addition, the dimensions of a smallest component of the counter and a smallest distance between the components of the counter are preferably no greater than 10 µm. Further preferably, the memory cell has an essentially 2-dimensional shape, that is, the memory cell is very flat. In particular, the height of the memory cell is no more than 2 µm to 100 µm.

The passive micromechanical counter can be combined with an energy converter to cover different limit value exceedances of a physical event. The energy converter can convert the physical event to be counted into mechanical energy in the form of mechanical pulses. The number of mechanical pulses can then be counted and stored by the counter.

A passive electromechanical counter constructed in this way is particularly suitable for the autonomous monitoring of limit value exceedances, for example, temperature, current, voltage and/or acceleration exceedances. The counter is preferably suitable for the maintenance of components that are difficult to access and at which corresponding limit values can occur. Furthermore, the counter is preferably suitable for monitoring the dynamic stress on buildings. The number of mechanical pulses can, for example, provide information about the use and/or wear and tear of the buildings to be monitored. Furthermore, the counter is suitable for monitoring components subject to vibration stress, such as aircraft wings. The fatigue strength and thus the service life of materials essentially depends on both the frequency of the changing stress and its amplitude. The counter can be attached alone or preferably in combination with a corresponding energy converter at the points of the component subject to vibration stress that are to be monitored, where said monitor monitors the service life of the corresponding component.

In a preferred development of the invention, it is provided that the cell input is designed to transmit the mechanical pulse to the latching mechanism in the form of a translational or rotational movement. In particular, the translational or rotational movement is defined and limited in terms of its size. This means that even with a strong mechanical pulse, the translational or rotational movement does not exceed the defined value. This protects the latching mechanism from mechanical pulses that are too high. The translational movement of the cell input is preferably between 1 and 100 µm. The rotational movement of the cell input is more preferably between 0.2 and 0.5 µrad. Furthermore, this also means that a weak mechanical pulse, as long as it is above a certain limit value, triggers the same translational or rotational movement as a strong pulse. The limit value of the mechanical pulse from which a translational or rotational movement is counted is preferably between 0.5 µm and 100 µm or between 50 µN and 2000 µN. The limit value of the mechanical pulse from which a translational or rotational movement is counted is particularly preferably at least 1 µm or 100 µN, +/−10%. In particular, the cell input is designed such that the cell input can move back and forth translationally in relation to the latching mechanism. Alternatively, the cell input is designed such that the cell input can rotate back and forth. Further preferably, the mechanical pulse leads to a deflection of the cell input.

In connection with the counting of the mechanical pulse, a preferred development of the invention provides that the latching mechanism is designed to change its discrete latching position with each mechanical pulse transmitted from the cell input. Thus, the absolute latching position of the latching mechanism correlates to the number of mechanical pulses transmitted. The latching mechanism accordingly forms the actual number memory of the memory cell. Incoming mechanical pulses at the cell input are mechanically counted with the aid of the latching mechanism. The deflection of the cell input is preferably counted. Further preferably, the deflection of the cell input is counted when the cell input moves back into its initial position. Provision is further preferably made for a distance between the cell input and the latching mechanism to be reduced with the changed discrete latching position. As the counter reading of the memory cell increases, the cell input thus moves closer to the latching mechanism and/or the latching mechanism moves closer to the cell input.

In particular, a further preferred development of the invention provides that a force for changing the discrete latching position is independent of the discrete latching position. The force for changing the discrete latching position of the latching mechanism, also referred to as switching force, is therefore independent of the counter reading of the memory cell. This has the particular advantage that the limit value of the mechanical pulse from which the cell input triggers the translational or rotational movement remains the same and does not change with the number of stored limit value exceedances. Reliable counting is thus possible.

The memory cell has a different storage capacity, depending on the dimensions of the memory cell. The storage capacity defines how many mechanical pulses can be registered by the memory cell and how many thereof can be stored. According to a preferred development of the invention, it is provided that the number of discrete latching positions of the latching mechanism defines the storage capacity of the memory cell. The number of possible mechanical pulses to be counted thus depends directly on the number of latching positions of the latching mechanism. For example, if the latching mechanism of the memory cell has 32 discrete latching positions, the storage capacity of the memory cell, expressed in bits, is 5 bits ($2^5$=32). Thus, depending on the dimensioning, a memory cell can basically store a data word of any length. The storage capacity of the memory cell is preferably at least 3 bits, that is, the latching mechanism therefore has at least 8 discrete latching positions.

In connection with the design of the latching mechanism, a preferred development of the invention provides that the latching mechanism comprises a runner or a rotor, and a counter-latch, wherein the runner or the rotor is able to be latched in the discrete latching position by means of latching teeth on the counter-latch. As already mentioned, the cell input is designed to transmit the mechanical pulse to the latching mechanism in the form of a translational or rotational movement. There are basically two forms to be distinguished. In the case of a translatory movement, the latching mechanism comprises a runner which can be latched onto the counter-latch by means of latching teeth. Alternatively, in the case of a rotary movement, the latching mechanism comprises a rotor which can be locked in the discrete latching position by means of the latching teeth on the counter-latch. The runner and the rotor and the counter-latch preferably comprise latching teeth. Further preferably, the latching teeth are arranged on the runner or on the rotor at fixed intervals. The latching mechanism particularly preferably comprises the runner. Further preferably, the runner has a linear shape, wherein the latching teeth are formed as projections along the runner. Each latching tooth of the runner and/or each latching tooth pairing of the runner and the counter-latch thus define the discrete latching position of the latching mechanism. The discrete latching position, which the runner can assume for the counter-latch, represents the stored counter reading of the memory cell. The counter-latch is preferably connected to the cell input and thus transmits the translatory movement of the cell input. Further preferably, during the translational movement, the counter-latch slides over the latching teeth of the runner without any significant expenditure of force. As soon as the latching teeth of the runner and the counter-latch are positively locked, the force is transmitted to the runner so that the discrete latching position is changed.

According to a further preferred development of the invention, the latching mechanism comprises a holding mechanism designed such that the runner can only be displaced along an axial direction, or that the rotor can only be rotated along one direction of rotation. The holding mechanism thus ensures that the runner can only be displaced in one direction along its axial direction of movement by blocking movements in the opposite direction. Alternatively, the holding mechanism ensures that the rotor can only be rotated in one direction along its direction of rotation by blocking rotations in the opposite direction of rotation. The holding mechanism thus fixes the runner or rotor in its currently reached discrete latching position. No counting backwards can thus take place within the latching mechanism. The holding mechanism preferably also ensures that the latching mechanism counts forward, since otherwise the runner could move with the cell input without a holding mechanism. The holding mechanism also preferably comprises latching teeth. Accordingly, the mode of operation of the holding mechanism is preferably based on a positive lock. Alternatively, other forms of holding mechanism such as grippers or a holding mechanism based on friction are possible.

In connection with the reading of the stored counter reading, according to a preferred development of the invention, it is provided that the electromechanical coding unit comprises contact electrodes and counter-electrodes, the discrete latching position of the latching mechanism being able to be determined by means of the spatial arrangement of the contact electrodes relative to the counter-electrodes. The task of the electromechanical coding unit is to digitize the discrete latching position of the latching mechanism, that is, to associate an electrical numerical code with the respective runner position. In principle, this can be a number code of any number system, for example, a binary number code, a decimal number code or a hexadecimal number code. However, it is preferred that the number of discrete latching positions of the latching mechanism of the memory cell corresponds in each case to a multiple of the base of the selected number system. If counting is to be carried out in a decimal system, for example, then the number of discrete latching positions of the latching mechanism preferably corresponds to a multiple of 10. The numeric code is particularly preferably a binary numeric code, that is, the electromechanical coding unit assigns an electrical binary numeric code to the discrete latching position of the latching mechanism. This has the advantage that an individual memory cell can be relatively small since the number of discrete latching positions of the latching mechanism is preferably only a multiple of two in each case. The electromechanical coding unit is particularly preferably designed such that an electrical binary signal can be generated by applying an electrical voltage to the electromechanical coding unit, the signal representing the discrete latching position of the latching mechanism.

According to the preferred development, the discrete latching position of the latching mechanism is digitized in that the discrete latching position of the latching mechanism can be determined by means of the spatial arrangement of the contact electrodes relative to the counter-electrodes. The runner preferably comprises a geometric coding with the aid of the specifically arranged contact electrodes. In other words, the contact electrodes are preferably located on the runner opposite the latching teeth. The contact electrodes act as switches. One set of contact electrodes on the rotor, each with a set of counter-electrodes, is required for each bit, that is, for each digit of the binary number code that associates the electromechanical coding unit with the discrete latching position. A set of contact electrodes is hereinafter referred to as bit branches. The contact electrodes preferably have a tooth-shaped or finger-shaped structure. In this case, the presence of a contact electrode on the bit branch preferably defines a logical one. The absence of a contact electrode preferably corresponds to a logical zero. In principle, however, an inverse definition is also possible.

Stationary scanning points in the form of counter-electrodes are preferably located opposite the contact electrodes on the runner. The counter-electrodes are further preferably mounted on the runner at a small or overlapping distance from the contact electrodes. If the runner is displaced translationally in the running direction, depending on the position, a counter-electrode and a contact electrode or no contact electrode are opposite each other. If the contact electrode and counter-electrode of a bit branch are opposite each other, this preferably corresponds to a logical one for the corresponding bit. Otherwise there is preferably a logical zero. A single bit branch therefore preferably represents one digit of the binary count. The number and size of the contact electrodes on a bit branch thus depends on the position of the digit of the binary number to be represented and on the overall size of the binary number.

If a memory cell with $2^n$ different latching positions has a storage capacity of n bits, n bit branches are also required in principle. For example, the storage capacity of the memory cell has 5 bits, that is, there are 32 ($2^5$=32) discrete latching positions. Accordingly, 5 bit branches are also required. In this case, the bit branch of the first position, or the zeroth bit, has $2^n/2$ contact electrodes. In the example above, there are $2^5/2$=16 contact electrodes. Said contact electrodes are arranged such that there is a contact electrode opposite every second latching tooth of the runner. The bit branch of the i-th bit then has $2^{n-1}/2$ contact electrodes. For the above example, the second digit (or the first bit, i=1) is $2^{5-1}/2$=8. For the bit branch of the fifth digit (or the fourth bit, that is, i=4), the result is $2^{5-4}/2$=1, as the number of contact electrodes. The discrete latching position of the latching mechanism is determined by a unique combination of different bit assignments.

The number of mechanical pulses is therefore preferably stored purely mechanically and not in binary form, but rather in analog form by means of the discrete latching position. However, a binary conversion of the counter reading preferably takes place when reading out via the electromechanical coding unit, so that a binary electrical signal can be generated directly. No analog electrical signal is therefore generated when reading out. This has the advantage that no additional electronics are required. Preferably, no analog-to-digital conversion is therefore necessary in order to generate the binary electrical signal.

In connection with the reading, it is also provided in a preferred development of the invention that the electromechanical coding unit comprises an electrically conductive material. The electromechanical coding unit preferably comprises doped silicon, An electrical voltage is preferably applied to the coding unit in the course of reading out. Depending on the position, the voltage is transmitted to the counter-electrode via the runner and thus the contact electrodes. This is possible via a direct mechanical contact between the contact electrodes and the counter-electrode, and in the non-contact state, A high-frequency AC voltage is preferably applied instead of a DC voltage in the case of the non-contact state. Counter-electrode and contact electrode then preferably form a capacitor which can be bridged by the AC voltage. When read out, the electrical signal generated in this way preferably reaches the electrical evaluation unit. In this case, a parallel, non-clocked electrical evaluation is further preferably implemented. This means that all bit states can be read out at the same time. For example, the voltage signal transmitted via the counter-electrode can be evaluated directly. In the course of this, corresponding pull-up or pull-down resistors can be provided at each voltage tap, so that the voltage potential at the respective voltage tap is clearly defined in every situation. Particularly preferably, a parallel digital electrical signal can be generated when reading out.

According to a further preferred development of the invention, the memory cell additionally comprises a transmitter and a reset mechanism. This has the advantage, in particular, that the memory cell can be connected in series to further memory cells. A total storage capacity of the passive mechanical counter can be increased drastically in this way.

In this case, it is preferably provided that the total storage capacity of the counter corresponds to the product of the individual storage capacities of the memory cells connected in series. The total storage capacity defines how many mechanical pulses can be registered by the counter and the number of which can be stored. For example, if a memory cell has a storage capacity of 5 bits, that is, 32 latching positions, the total storage capacity of the counter can be increased to 10 bits (5+5) by serially connecting one such memory cell to a second such memory cell. The 10 bits correspond to 1024 ($2^{10}$=1024 or 32×32=1024) different possibilities at different discrete latching positions of the two memory cells combined, although the two memory cells together provide only 64 discrete latching positions (32+32=64). In other words, the total storage capacity of the counter corresponds to the product of the storage capacities of the individual memory cells (32×32=1024). The counter can thus count 1024 mechanical pulses from two such 5-bit memory cells. The number of discrete latching positions that the latching mechanism of a memory cell has can be limited due to the size of the memory cell. The individual memory cells can be connected in series via the transmitter and the reset mechanism. This has a positive effect on system size, functional reliability and total storage capacity per unit area.

In this context, according to a further preferred development of the invention, it is provided that the counter comprises at least two memory cells connected to one another in series, wherein each memory cell additionally comprises a transmitter and a reset mechanism. The two memory cells can be coupled to one another via the transmitter. The transmitter preferably connects the output of the first memory cell to the cell input of the second memory cell arranged in series.

According to a further preferred development of the invention, the transmitter is designed to transmit the mechanical pulse to the cell input of the further memory cell connected in series when the storage capacity of the memory cell is reached. The transmitter thus enables a digit transfer from one memory cell to the next. When a memory cell reaches its storage capacity, the next mechanical pulse that would cause the memory to overflow is preferably transmitted via the transmitter to the next serially connected memory cell. The transmitter preferably comprises a positive-locking element. As soon as the runner of the first memory cell has reached the last possible discrete latching position and thus the last possible memory value, there is a mechanical connection between the positive-locking element and the cell input of the serially connected memory cell. If a further mechanical pulse acts at the cell input of the first memory cell, then the mechanical pulse can be forwarded directly to the next memory cell via the mechanical connection.

In connection with reaching the storage capacity of the memory cell, a further preferred development of the invention provides that the reset mechanism is designed to change the discrete latching position of the latching mechanism by the mechanical pulse when the storage capacity of the memory cell is reached such that it corresponds to an initial state. The task of the reset mechanism is therefore to set the mechanically stored numerical value of the memory cell back to the initial state. If the memory cell overflows, in addition to the transfer of the number to the next memory cell, the memory locations of the overflowed memory cell are also reset to zero. The initial state of the memory cell thus preferably corresponds to a counter reading of the counter of zero. The resetting is preferably implemented by the reset mechanism in that, after reaching the last discrete latching position of the latching mechanism, said reset mechanism releases the fixation between the latching teeth of the runner and the counter-latches, so that the runner can move into its initial state.

In this context, a further preferred development of the invention provides that flexure hinges in the form of guide springs are used to guide the runner and to guide the cell input. The guide springs preferably exhibit linear and/or non-linear spring characteristics. Non-linear guide springs having a constant restoring force are particularly preferred. With these springs, the spring force is constant for a certain deflection range and does not increase with further deflection of the spring. With the aid of the non-linear spring, the fierce that has to be applied to increment the counter reading at the cell input is independent of the counter reading that has already been reached at the memory cell.

The invention is explained below by way of example with reference to the drawings based on a preferred embodiment.

THE DRAWING SHOWS

Figure 2:
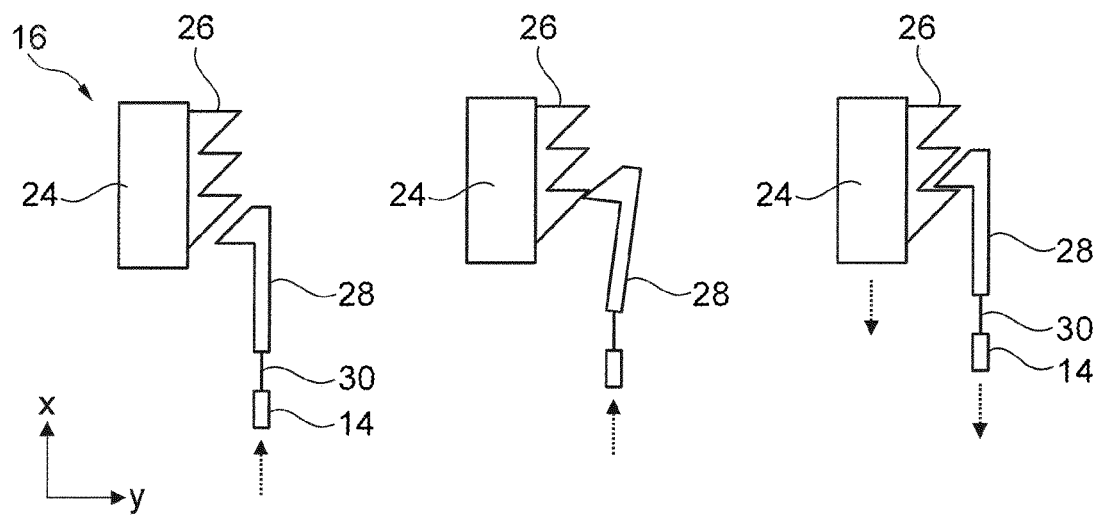
Figure 6:
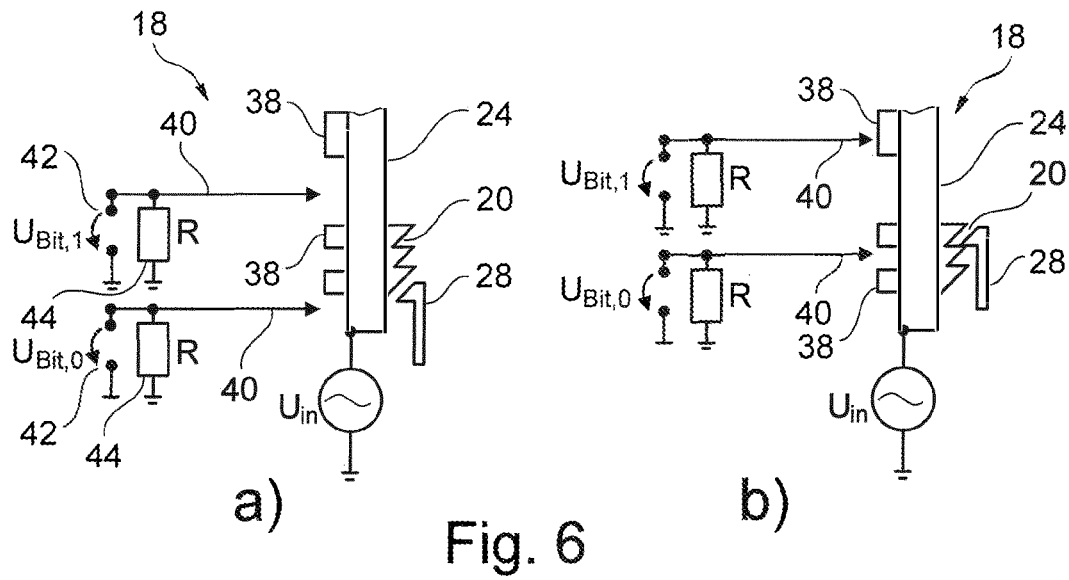
Figure 7:
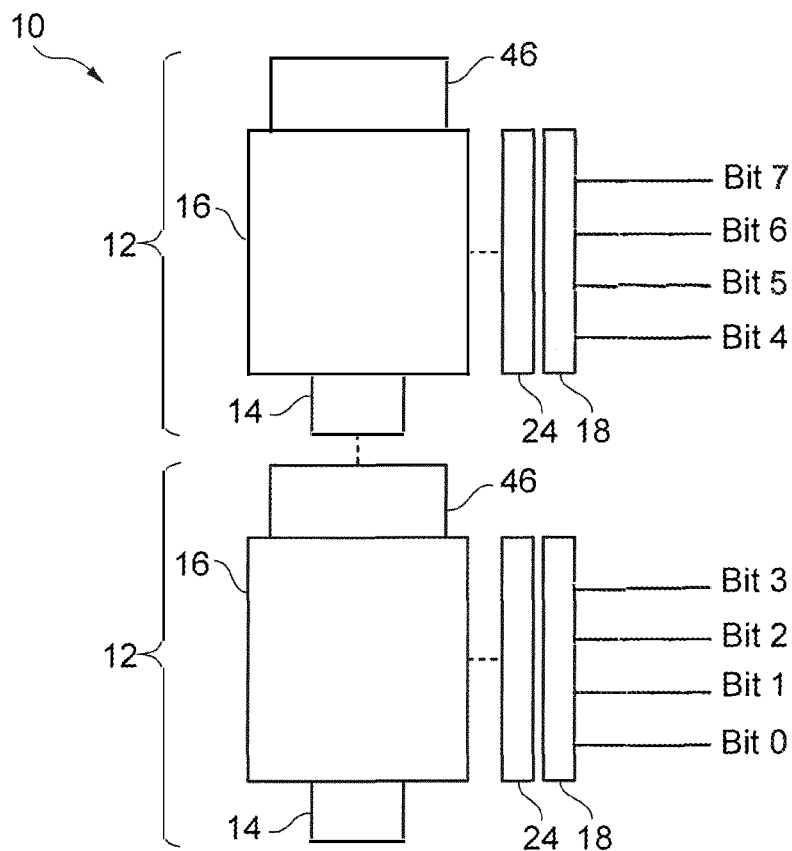
Figure 8:
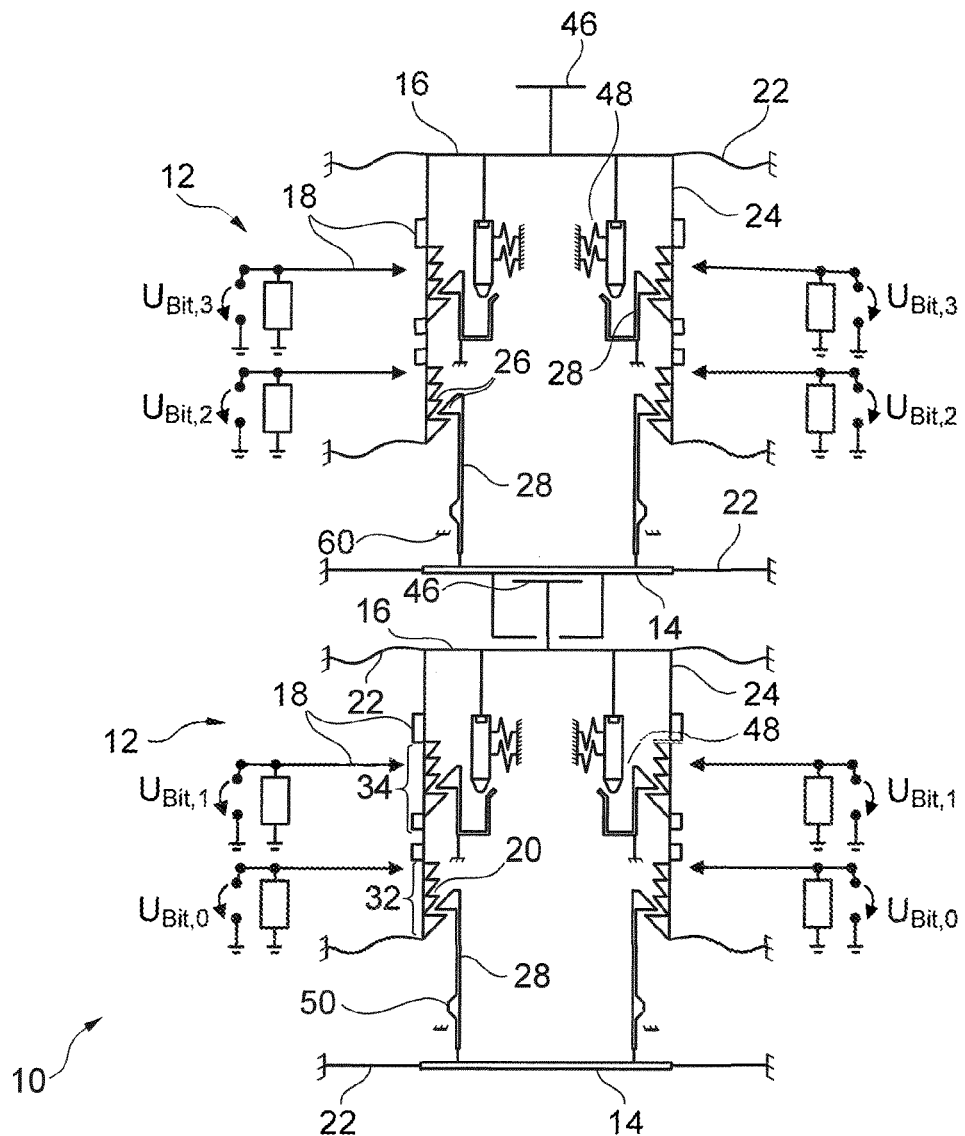
Figure 9:
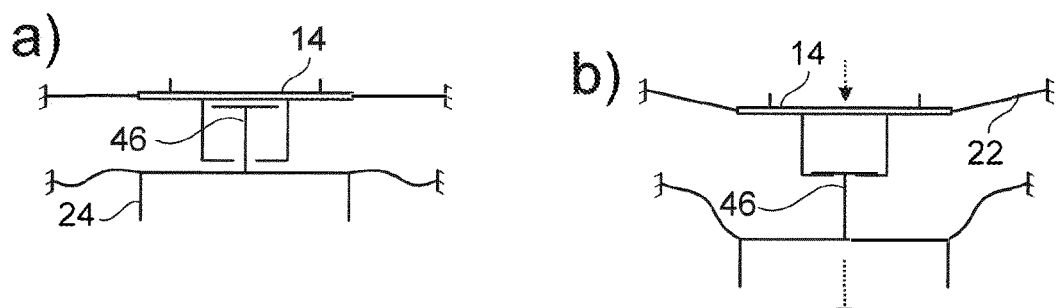

FIG. 1 a schematic representation of a passive micromechanical counter according to a preferred embodiment of the invention, FIG. 2 a schematic representation of a latching mechanism of the counter from FIG. 1 for illustrating the functional principle, FIG. 3 in FIG. 3a), a schematic representation of a holding mechanism of the counter from FIG. 1 and in FIG. 3b) an alternative embodiment of the holding mechanism, FIG. 4 a schematic of the process of directly incrementing the counter reading of the counter from FIG. 1, FIG. 5a schematic of the process of indirectly incrementing the counter reading of the counter from FIG. 1, FIG. 6 a schematic representation of an electromechanical coding unit of the counter from FIG. 1, FIG. 7a schematic representation of a passive micromechanical counter according to a further preferred embodiment of the invention, FIG. 8a more detailed representation of the counter from FIG. 7, FIG. 9 a schematic representation of a transmitter of the counter from FIGS. 7 and 8 and FIG. 10 a schematic representation of a reset mechanism of the counter from FIGS. 7 and 8 and the schematic of the process of resetting the counter reading of the counter from FIGS. 7 and 8.

FIG. 1 shows a schematic representation of a first embodiment of a passive micromechanical counter 10. The passive micromechanical counter 10 comprises at least one memory cell 12, the memory cell 12 comprising a cell input 14, a latching mechanism 16 and an electromechanical coding unit 18. The cell input 14 is designed to mechanically transmit a mechanical pulse to the latching mechanism 16, the latching mechanism 16 being designed to store the number of transmitted mechanical pulses by means of its discrete latching position 20. Applying an electrical voltage to the electromechanical coding unit 18 can generate an electrical digital signal representing the discrete latching position 20 of the latching mechanism 16.

FIG. 1 shows an embodiment of the invention in which the individual memory cell 12 comprises the latching mechanism 16, the cell input 14, the electromechanical coding unit 18 and a plurality of non-linear flexure guides 22 in the form of flexure hinges. FIG. 1 further shows that the memory cell 12 is constructed symmetrically, that is, said memory cell comprises two pairs of almost every component which are arranged as mirror images of one another. In the present embodiment, the latching mechanism 16 is U-shaped, the two legs of the U-shape being formed by two runners 24. The cell input 14 transmits the mechanical pulse at the input of the memory cell 12 to the latching mechanism 16 in the form of a fixed and constrained displacement. In the embodiment, this involves a translational forward and/or backward movement of the cell input 14, the movement being limited by a stopper 60.

FIG. 2 shows a section of latching mechanism 16 of memory cell 12 from FIG. 1. The latching mechanism 16 is the actual number memory of the memory cell 12. The latching mechanism comprises the runner 24 on which latching teeth 26 are arranged at fixed intervals. As a counter-component to the latching teeth 26, the latching mechanism 16 comprises a counter-latch 28. In the present embodiment, the counter-latch 28 is connected to the cell input 14 via a spiral spring 30. The counter-latch 28 is thus mounted flexibly for deflections in the v-direction, but rigidly for deflections in the x-direction. The counter-latch 28 slides over the latching teeth 26 of the runner 24 essentially without great expenditure of energy. As soon as the latching tooth 26 and the counter-latch 28 are positively locked, the force is transmitted from the cell input 14 to the runner 24 in the x-direction.

FIG. 3a) shows a further detail of the latching mechanism 16 of the memory cell 12 from FIG. 1. The latching mechanism 16 is further divided into an incrementer 32 and a holding mechanism 34. The holding mechanism 34 acts like a mechanical "diode". Said holding mechanism ensures that the runner 24 can only be displaced in one direction along its uniaxial direction of movement by blocking movements in the opposite direction. The holding mechanism 34 thus fixes the runner 24 in its currently reached discrete latching position 20 while a force in the direction of the blocked direction may be transmitted to the runner 24 via the incrementer 32. Without the holding mechanism 34, the counter cannot be incremented in the present embodiment, since otherwise the runner 24 would always move with the cell input 14. In FIG. 3a), the holding mechanism 34 is based on a positive lock and also has latching teeth 26 for this purpose. FIG. 3b) schematically shows an alternative embodiment of the holding mechanism 34 in the form of a gripper 36 in which the runner 24 is fixed via a force lock instead of a positive lock.

The incrementer 32 is a pairing of latching teeth 26 of the runner 24 and counter-latch 28. The latching teeth 26 are located on the runner 24. Said latching teeth define the discrete latching positions 20 that the runner 24 can assume. The runner 24 is suspended via the flexure hinge 22 such that it can be uniaxially displaced in a translatory manner in the x-direction. The restoring forces of the flexure hinges 22 are designed such that they always act constantly and independently of the position of the runner 24.

FIGS. 4 and 5 schematically show the sequence of two ways of incrementing the counter reading of counter 10. The counter reading of a memory cell 12 can be incremented both directly (FIG. 4) and indirectly (FIG. 5). The mechanical energy of the mechanical pulse is used directly for counting in direct incrementing. The counter reading is then incremented at the same time as the cell input 14 moves forward. The energy of the mechanical pulse is initially stored temporarily via a spring in indirect incrementing. The counter reading is then only incremented when the mechanical pulse subsides and the cell input 14 moves back to its original position.

FIG. 4 shows the switching sequence for direct incrementing: if a mechanical pulse ↓1 is first introduced at the cell input 14 (FIG. 4b), this displacement is transmitted ↓3 directly via the counter-latch 28, ↓2 to the runner 24, so that said runner is also deflected. At the same time, the fixation of the runner 24 on the holding mechanism 34 is released in that the counter ratchet 28 of the holding mechanism 34 slides over the associated latching teeth 26 ↷ 4. If the cell input 14 is further deflected to its end position (FIG. 4c), the counter-latch 28 on the holding mechanism 34 overcomes it the associated latching tooth 26, ↶ 4. If the cell input 14 now moves back to its initial position (FIG. 4d) ↑1, the counter-latch 28 of the incrementer 32 is pushed over ↑2, ↷ 3 the next associated latching tooth 26. The incrementing process is thus completed as shown in FIG. 4e).

FIG. 5 shows the switching sequence for indirect incrementing: Here, too, the cell input 14 is initially deflected (FIG. 5b), but in the opposite direction ↑1 compared to FIG. 4. The displacement ↑1 is transmitted ↑2 directly from the cell input 14 to the counter-latch 28 of the incrementer 32. The counter-latch 28 of the incrementer 32 finally slides over the next associated latching tooth 26 on the runner 24, ↷ 3, as shown in FIG. 5b). The runner 24 itself has not yet been displaced up to this point in time, since the holding mechanism 34 fixes the runner 24 (FIG. 5c). Only when the cell input 14 is moved back to the initial position (FIG. 5d) ↓1, is the runner 24 pulled down ↓2↓3 over the counter-latch 28 of the incrementer 32. The energy required to reset the cell input 14 is supplied by the return spring 22 of the cell input 14. While the runner 24 is now displaced down ↓3, the counter-latch 28 of the holding mechanism 34 slides over the next associated latching tooth 26 ↷ 3 and thus finally fixes the latching position 20 that has been reached. The incrementing process of the memory cell 12 is thus completed, as shown in FIG. 5e).

FIG. 6 schematically shows a further detail from the memory cell 12 from FIG. 1, the electromechanical coding unit 18 in particular being visible here. The task of the electromechanical coding unit 18 is to digitize the discrete latching position 20 of the runner 24, that is, to associate an electrical binary numerical code with the respective discrete latching position 20. For this purpose, the runner 24 has a geometric coding in the form of specifically arranged contact electrodes 38 which serve as switches. A set of contact electrodes 18, also referred to as bit branches, each having at least one associated counter-electrode 40, is required for each bit that is to be encoded. In this embodiment, the contact electrodes 38 have a finger-shaped structure. Opposite the contact electrodes 38 on the runner 24 are stationary scanning points in the form of the counter-electrodes 40 flexibly attached to the frame of the counter 10. The counter-electrodes 40 are mounted on the runner 24 at a small or overlapping distance from the contact electrodes 38. If the runner 24 is displaced transiationally in the running direction, depending on the position, a counter-electrode 40 and a contact electrode 38 or no contact electrode 38 are opposite each other. If a contact electrode 38 and a counter-electrode 40 face each other, this corresponds to a logical one for the corresponding bit. Otherwise, there is a logical zero. In FIG. 6a), the runner 24 is in the initial state, which corresponds to an initial state of the latching mechanism 16 and thus has a counter reading of 0. The electromechanical coding unit 18 associates the binary number code 00 to said counter reading, since the two contact electrodes 38 are not located opposite a counter-electrode 40. In FIG. 6b), the runner 24 is latched in the second latching position and thus has a counter reading of 2. The binary number code 10 is associated with said counter reading via the electromechanical coding unit 18, since the contact electrodes 38 for the first digit of the binary number, which corresponds to the lower contact electrode 38, are not located opposite a counter-electrode 38 (state 0), and the upper contact electrode 38, which encodes the second digit of the binary number, is located opposite a counter-electrode 40 (state 1).

An electrical voltage is first applied to the electromechanical coding unit 18 for electrical evaluation. Depending on the position, the voltage is transmitted to the counter-electrode 40 via the runner 24 and thus the contact electrode 38. This is possible both via a direct mechanical contact between the contact electrode 38 and counter-electrode 40, as shown in FIG. 6, and in the non-contact state. The electrical signal then reaches the electrical evaluation unit. A parallel, non-clocked electrical evaluation is implemented. All bit stales can therefore be read out simultaneously. In the embodiment shown here, the voltage signal transmitted via counter-electrode 40 is evaluated directly by providing corresponding pull-up or pull-down resistors 44 at each voltage tap 42, so that the voltage potential at the respective voltage tap 42 is clearly defined in every situation.

FIG. 7 schematically shows a further embodiment of the counter 10, the counter 10 comprising two memory cells 12 in this embodiment. FIG. 8 shows a detailed view of the embodiment from FIG. 7. As in the first embodiment in FIG. 1, the memory cells 12 comprise the cell input 14, the latching mechanism 16 and the electromechanical coding unit 18. Furthermore, the memory cells each comprise a transmitter 46 and a reset mechanism 48 (can only be seen in FIG. 8). In this embodiment, the two memory cells 12 are connected to one another in series via the transmitter 46. In this case, the transmitter 46 connects the output of the first memory cell 12 to the cell input 14 of the second memory cell 12 arranged in series. The counter 10 shown in FIG. 7 has a storage capacity of 8 bits, each memory cell 12 having a storage capacity of 4 bits each. The counter shown in FIG. 8 has a storage capacity of 4 bits, each memory cell 12 having a storage capacity of 2 bits each.

The transmitter 46 is furthermore shown in FIG. 9. The transmitter 46 is designed to transmit the mechanical pulse to the cell input 14 of the further memory cell 12 connected in series when the storage capacity of the memory cell 12 is reached. In the embodiment shown, the transmitter 46 comprises a positive-locking element in the shape of a T. As soon as the runner 24 of the first memory cell 12 has reached the last possible discrete latching position 20 and thus the last possible storage value, a mechanical connection occurs between the T-shaped positive-locking element and the cell input 14 of the serially connected memory cell 12 (see FIG. 9b). If a further mechanical pulse now acts at the cell input 14 of the first memory cell 12, the mechanical pulse is forwarded directly to the next memory cell 12 via the mechanical connection.

FIG. 10 shows the functional principle of the reset mechanism 48. The reset mechanism 48 is designed to change the discrete latching position 20 of the latching mechanism by the mechanical pulse 16 such that it corresponds to the initial state when the storage capacity of the memory cell 12 is reached. This is implemented by the reset mechanism 48 in that after the last discrete latching position 20 of the latching mechanism 16 has been reached, it releases the fixation between the latching teeth 26 of the runner 24 and the counter-latch 28, so that the runner 24 can move into its initial state via the restoring force of the guide springs 22. The reset mechanism 48 is divided into two functional groups. One of them ensures that the connection between the latching teeth 26 on the incrementer 32 is opened at a certain deflection; the second part ensures that the holding mechanism 34 opens. Two tappets 50 are located on the incrementer 32 for this purpose. One tappet 50 is located spring-loaded in a stationary position via the frame, the other is located on the counter-latch 28 of the incrementer 32. As soon as the cell input 14 and thus the counter-latch 28 is deflected beyond a critical distance, the tappet 50 presses open the connection between the counter-latch 28 and the latching tooth 26, so that the connection on the incrementer 32 is released. The connection of the holding mechanism 34 is opened with the aid of a locking unit 52 and is held open until the memory cell 12 has been completely reset. In the embodiment, the last latching tooth 26, in contrast to the other ratchet teeth 26, is designed to enter into a particularly loose mechanical connection with the counter-latch 28. The positive-locking connections between counter-latches 28 and the other latching teeth, on the other hand, are designed to be so robust that they cannot be pressed open by the tappet 50. Rather, in this case, the spring-loaded tappet 50 is briefly deflected by the spring.

FIG. 10 shows the basic sequence when resetting memory cell 12: FIG. 10a) firstly shows the latching mechanism 16 of the memory cell 12 which has already reached its maximum storage capacity. If a further direct incrementation is now carried out (FIG. 10b), the counter-latch 28 and thus the runner 24 are first deflected ↓1, ↓2 in the negative x-direction. At the same time, in the locking unit 52, the slide bolt 56 is pushed ↓3 into the bolt holder 58 via a slide 54, The counter-latch 28 of the holding mechanism 34 is then opened ↷4. If, as shown in FIG. 10c), the cell input 14 is deflected even further, the counter-latch 28 on the incrementer 32 is deflected ↷5 via the tappet 50 and thus opens the mechanical connection to the runner 24. The runner 24 is thus no longer fixed, neither by the holding mechanism 34 nor by the incrementer 32. Finally, due to the restoring forces of the guide springs 22 (not shown in FIG. 10), the runner 24 is pulled back ↑3 in the x-direction (FIG. 10d). As soon as the runner 24 reaches its end position, the locking of the counter-latch 28 of the holding mechanism 34 is released ↑4 again via the slide 54, so that, as shown in FIG. 10e), the counter-latch 28 of the holding mechanism 34 engages again ↶3.

LIST OF REFERENCE NUMERALS 10 passive micromechanical counter
12 memory cell
14 cell input
16 latching mechanism
18 electromechanical coding unit
20 discrete latching position
22 flexure guide, flexure hinge, guide spring
24 runner
26 latching tooth
28 counter-latch
30 spiral spring
32 incrementer
34 holding mechanism
36 gripper
38 contact electrode
40 counter-electrode
42 voltage tap
44 pull-up and pull-down resistor
46 transmitter
48 reset mechanism
50 tappet
52 locking unit
54 slide
56 slide bolt
58 bolt holder
60 stopper

The invention claimed is:

1. A passive micromechanical counter for counting and storing a number of mechanical pulses, comprising at least one memory cell,
   the memory cell comprising a cell input, a latching mechanism and an electromechanical coding unit,
   the cell input being designed to mechanically transmit the mechanical pulse to the latching mechanism,
   the latching mechanism being designed to store the number of transmitted mechanical pulses by means of its discrete latching position,
   wherein an electrical digital and binary signal can be generated without an analog-to-digital converter by applying an electrical voltage to the electromechanical coding unit, wherein the electrical digital and binary signal represents the discrete latching position of the latching mechanism.

2. The passive micromechanical counter according to claim 1, wherein the cell input is designed to transmit the mechanical pulse to the latching mechanism in the form of a translatory or rotary movement.

3. The passive micromechanical counter according to claim 1, wherein the latching mechanism is designed to change its discrete latching position with each mechanical pulse transmitted from the cell input.

4. The passive micromechanical counter according to claim 3, wherein a force for changing the discrete latching position is independent of the discrete latching position.

5. The passive micromechanical counter according to claim 1, wherein the number of discrete latching positions of the latching mechanism defines a storage capacity of the memory cell.

6. The passive micromechanical counter according to claim 1, wherein the latching mechanism comprises a runner or a rotor, and a counter-latch, wherein the runner or the rotor can be latched by means of latching teeth on the counter-latch in the discrete latching position.

7. The passive micromechanical counter according to claim 6, wherein the latching mechanism comprises a holding mechanism designed such that the runner can only be displaced along an axial direction, or that the rotor can only be rotated along one direction of rotation.

8. The passive micromechanical counter according to claim 1, wherein the electromechanical coding unit comprises contact electrodes and counter-electrodes, wherein the discrete latching position of the latching mechanism can be determined by means of a spatial arrangement of the contact electrodes relative to the counter-electrodes.

9. The passive micromechanical counter according to claim 1, wherein the memory cell additionally comprises a transmitter and a reset mechanism.

10. The passive micromechanical counter according to claim 1, wherein the counter comprises at least two memory cells connected in series with one another, wherein each storage cell additionally comprises a transmitter and a reset mechanism.

11. The passive micromechanical counter according to claim 10, wherein the transmitter is designed to transmit the mechanical pulse to the cell input of the further storage cell connected in series when the storage capacity of the storage cell is reached.

12. The passive micromechanical counter according to claim 10, wherein a total storage capacity of the counter corresponds to the product of the individual storage capacities of the memory cells connected in series.

13. The passive micromechanical counter according to claim 11, wherein the reset mechanism is designed to change the discrete latching position of the latching mechanism by the mechanical pulse so that said position corresponds to an initial state when the storage capacity of the storage cell is reached.

* * * * *